(12) United States Patent
Morikita et al.

(10) Patent No.: US 10,707,088 B2
(45) Date of Patent: Jul. 7, 2020

(54) METHOD OF PROCESSING TARGET OBJECT

(71) Applicant: Tokyo Electron Limited, Tokyo (JP)

(72) Inventors: Shinya Morikita, Miyagi (JP); Takanori Banse, Miyagi (JP); Yuta Seya, Miyagi (JP); Ryosuke Niitsuma, Hillsboro, OR (US)

(73) Assignee: TOKYO ELECTRON LIMITED, Tokyo (JP)

( * ) Notice: Subject to any disclaimer, the term of this patent is extended or adjusted under 35 U.S.C. 154(b) by 262 days.

(21) Appl. No.: 15/673,621

(22) Filed: Aug. 10, 2017

(65) Prior Publication Data

US 2018/0047578 A1 Feb. 15, 2018

(30) Foreign Application Priority Data

Aug. 12, 2016 (JP) .................. 2016-158659

(51) Int. Cl.
*H01L 21/311* (2006.01)
*H01L 21/02* (2006.01)
*H01J 37/32* (2006.01)
*H01L 21/027* (2006.01)
(Continued)

(52) U.S. Cl.
CPC .. *H01L 21/31116* (2013.01); *H01J 37/32082* (2013.01); *H01J 37/32165* (2013.01); *H01L 21/0228* (2013.01); *H01L 21/0276* (2013.01); *H01L 21/02164* (2013.01); *H01L 21/02219* (2013.01); *H01L 21/02274* (2013.01); *H01L 21/0337* (2013.01); *H01L 21/31138* (2013.01);
(Continued)

(58) Field of Classification Search
CPC ........... H01L 21/0276; H01L 21/31144; H01L 21/02164; H01L 21/02274; H01L 21/67069; H01J 37/32082; H01J 37/32165
USPC .................. 438/699, 702, 703, 717, 736
See application file for complete search history.

(56) References Cited

U.S. PATENT DOCUMENTS

2008/0047932 A1* 2/2008 Terasaki .................. C03C 17/42
216/41
2015/0076705 A1* 3/2015 Singh .................... H01L 23/481
257/774
(Continued)

FOREIGN PATENT DOCUMENTS

JP 2004-080033 A 3/2004
JP 2008-078617 A 4/2008
(Continued)

*Primary Examiner* — Binh X Tran
(74) *Attorney, Agent, or Firm* — Pearne & Gordon LLP

(57) ABSTRACT

A method of processing a target object is provided. The target object has an etching target layer, an organic film on the etching target layer and a mask on the organic film. The organic film includes a first layer and a second layer, the mask is provided on the first layer, the first layer is provided on the second layer, and the second layer is provided on the etching target layer. The method includes generating plasma of a first gas within a processing vessel of a plasma processing apparatus in which the target object is accommodated; etching the first layer with the plasma of the first gas and the mask until the second layer is exposed; and conformally forming a protection film on a side surface of the first layer; and generating plasma of a second gas and removing the mask with the plasma of the second gas.

18 Claims, 7 Drawing Sheets

(51) Int. Cl.
*H01L 21/033* (2006.01)
*H01L 21/67* (2006.01)

(52) U.S. Cl.
CPC .. *H01L 21/31144* (2013.01); *H01L 21/67069* (2013.01)

(56) References Cited

U.S. PATENT DOCUMENTS

| | | | | |
|---|---|---|---|---|
| 2015/0160557 A1* | 6/2015 | deVilliers | ............. | G03F 7/2024 430/323 |
| 2016/0163557 A1* | 6/2016 | Hudson | ............. | H01L 21/30655 438/696 |
| 2017/0178899 A1* | 6/2017 | Kabansky | ......... | H01L 21/02211 |
| 2019/0252198 A1* | 8/2019 | Morikita | ............. | H01L 21/3065 |

FOREIGN PATENT DOCUMENTS

| | | | |
|---|---|---|---|
| JP | 2013-161913 A | 8/2013 |
| JP | 2016-021546 A | 2/2016 |
| JP | 2016-076620 A | 5/2016 |

\* cited by examiner

METHOD OF PROCESSING TARGET OBJECT

CROSS-REFERENCE TO RELATED APPLICATION

This application claims the benefit of Japanese Patent Application No. 2016-158659 filed on Aug. 12, 2016, the entire disclosures of which are incorporated herein by reference.

TECHNICAL FIELD

The embodiments described herein pertain generally to a method of processing a target object.

BACKGROUND

As a kind of a plasma processing of a target object by using a plasma processing apparatus, there is a plasma etching. A resist mask used in the plasma etching is formed by a photolithography technique, and a limit size of a pattern formed on an etching target layer depends on a resolution of the resist mask formed by the photolithography technique. There is, however, a limit in the resolution of the resist mask (that is, a resolution limit). As a demand for high integration of electronic devices is getting higher, it is required to form a pattern smaller than the resolution limit of the resist mask. For this reason, as described in Patent Document 1, there is proposed a technique of adjusting a size of the resist mask and reducing a width of an opening of the resist mask by forming a silicon oxide film on the resist mask.
Patent Document 1: Japanese Patent Laid-open Publication No. 2004-080033

Meanwhile, as the electronic devices are miniaturized to meet the recent trend of the high integration, it is required to control a critical dimension (CD) with high accuracy when forming the pattern on the target object, particularly, when performing the etching on an organic film or the like included in a multilayered structure. In such a case, though a silicon-containing antireflection film formed on the organic film is used as a mask for the etching of the organic film, there may be a trade-off relationship between a removal of the mask formed from the antireflection film and an influence upon a sidewall shape of the organic film. In this regard, there has been a demand for a technique capable of reducing the influence of the removal of the mask for use in the etching of the organic film upon the sidewall shape of the organic film.

SUMMARY

In an exemplary embodiment, there is provided a method of processing a target object. The target object has an etching target layer, an organic film provided on the etching target layer and a mask provided on the organic film. The organic film includes a first layer and a second layer, the mask is provided on the first layer, the first layer is provided on the second layer, and the second layer is provided on the etching target layer. The method includes generating plasma of a first gas within a processing vessel of a plasma processing apparatus in which the target object is accommodated; etching the first layer with the plasma of the first gas and the mask until the second layer is exposed; and conformally forming a protection film on a side surface of the first layer formed by the etching (referred to as "process a"); and generating plasma of a second gas within the processing vessel and removing the mask with the plasma of the second gas (referred to as "process b"). The process b is performed before the etching target layer is etched.

In the method, a part (first layer) of the organic film is etched, and then, the protection film is conformally formed on the side surface of the first layer formed by this etching before the second layer of the organic film is etched. As stated, in the etching of the organic film, the protection film is formed, in the process a, on the side surface of the mask (hereinafter, referred to as "organic film mask") made of the organic film formed after the etching of the first layer. Therefore, the organic film mask can be suppressed from being etched in the subsequent etching of the second layer. Accordingly, the second layer can be etched while maintaining the shape of the organic film mask. Thus, in the etching processing upon the organic film including the process a, a top CD (corresponding to a width of an upper end of the first layer) and a bottom CD (corresponding to a width of the second layer) of the etched organic film can be controlled independently. Furthermore, since the mask (provided on the organic film) is removed in the process b before the etching of the etching target layer, the vertical shape of the organic film is maintained at the time when the mask is removed. Thus, a process margin in the subsequent etching processing upon the etching target layer can be obtained.

The second gas may contain any one of a hydrofluorocarbon gas, a fluorocarbon gas and a chlorine gas. Since the second gas contains halogen such as fluorine or chlorine, the mask can be removed appropriately.

The first gas may contain a hydrogen gas and a nitrogen gas. Since the first gas contains the hydrogen gas and the nitrogen gas, the etching of the organic film can be performed appropriately.

The protection film is an oxide film. Since the protection film is the oxide film, the etching amount of the second layer can be appropriately controlled in case that the etching is performed on the second layer with high selectivity against the oxide film.

In the process a, the protection film is conformally formed on the side surface of the first layer by repeatedly performing, after the etching of the first layer until the second layer is exposed, a first sequence including supplying a third gas into the processing vessel (referred to as "process c"); purging a space within the processing vessel after performing the process c (referred to as "process d"); generating plasma of a fourth gas within the processing vessel after performing the process d (referred to as "process e"); and purging the space within the processing vessel after performing the process e. In the process c, plasma of the third gas is not generated. As stated, in the process a, since the protection film is conformally formed on the side surface of the first layer by the same method as ALD (Atomic Layer Deposition) method, strength of protection for the first layer can be improved, and the protection film which protects the first layer can be formed in the uniform thickness.

The third gas may contain an aminosilane-based gas. Since the third gas contains the aminosilane-based gas, reaction precursors of silicon can be formed, by the process c, on the first layer or the like along an atomic layer on a side surface of the first layer or the like.

The third gas may contain monoaminosilane. By using the third gas containing the monoaminosilane, it is possible to form the reaction precursors of silicon in the process c.

The aminosilane-based gas contained in the third gas may include aminosilane having one to three silicon atoms. The aminosilane-based gas contained in the third gas may include aminosilane having one to three amino groups. As stated, the aminosilane-based gas contained in the third gas may be implemented by the aminosilane having the one to three silicon atoms. Alternatively, the aminosilane-based gas contained in the third gas may be implemented by the aminosilane having the one to three amino groups.

The fourth gas may contain an oxygen atom. The fourth gas may contain a carbon dioxide gas or an oxygen gas. As stated, since the fourth gas contains oxygen atoms, in the process e, the oxygen atoms bond to the reaction precursors of silicon formed on the first layer and the like, so that the protection film of silicon oxide can be conformally formed on the first layer. Further, in case that the fourth gas is the carbon dioxide gas, since the fourth gas contains carbon atoms, the removal of the first layer caused by the oxygen atoms can be suppressed by the corresponding carbon atoms.

The process a includes generating plasma of a fifth gas within the processing vessel after the repeatedly performing of the first sequence; and removing a film, which is formed on a surface of the second layer by the repeatedly performing of the first sequence, with the plasma of the fifth gas. The fifth gas contains fluorine. As stated, the etching upon the film which is formed by repeatedly performing the first sequence is anisotropically performed with the plasma of the fifth gas containing fluorine, and the film formed on the surface of the second layer can be selectively removed. Thus, after this removal, the etching upon the second layer is enabled.

The fifth gas may contain a fluorocarbon gas. As stated, since the fifth gas contains the fluorocarbon gas, the protection film formed in the process a can be etched.

The process e includes irradiating secondary electrons to the first layer by generating plasma within the processing vessel and applying a negative DC voltage to an upper electrode provided in the processing vessel before the conformally forming the protection film on the side surface of the first layer and after the etching of the first layer until the second layer is exposed. As stated, in the process a, since the secondary electrons are irradiated to the first layer after the first layer is etched until the second layer is exposed, the first layer can be modified before the protection film is formed. Therefore, the damage upon the first layer that might be caused by the subsequence process can be suppressed The method further includes generating, after the process b, plasma of a sixth gas within the processing vessel; and etching the second layer until the etching target layer is exposed with the plasma of the sixth gas, the first layer and the protection film while maintaining a shape of the first layer. As stated, the second layer is etched until the etching target layer is exposed. Then, since the surface of the etching target layer is exposed, the subsequent etching upon the etching target layer is enabled.

The sixth gas may contain a nitrogen gas and a hydrogen gas. As stated, the etching of the organic film can be performed with high verticality with the plasma of the sixth gas containing the hydrogen gas and the nitrogen gas. Thus, the variation in the pattern width formed by the etching can be suppressed.

The method further includes etching the etching target layer after the process f (referred to as "process g"). In the process g, the etching target layer is etched by removing every atomic layer of the etching target layer by repeatedly performing a second sequence including generating plasma of a seventh gas within the processing vessel; and forming a mixed layer containing radicals contained in the plasma of the seventh gas on an atomic layer of a surface of the etching target layer; purging a space within the processing vessel after the forming of the mixed layer; generating plasma of an eighth gas within the processing vessel after the purging of the space; and removing the mixed layer by applying a bias voltage to the plasma of the eighth gas; and purging the space within the processing vessel after the removing of the mixed layer. The seventh gas may contain a fluorocarbon gas, a rare gas and an oxygen gas, and the eighth gas may contain a rare gas. As stated, through the process g, every atomic layer of the etching target layer can be removed by the same method as an ALE (Atomic Layer Etching) method.

The second layer has a thickness ranging from 10 nm to 20 nm before the process b. If the thickness of the second layer is in the range from 10 nm to 20 nm, it is possible to adjust a width of the second layer appropriately in the process b.

According to the exemplary embodiments as described above, it is possible to achieve a technique in which the influence of the removal of the mask for use in the etching of the organic film upon the sidewall shape of the organic film can be reduced.

The foregoing summary is illustrative only and is not intended to be in any way limiting. In addition to the illustrative aspects, embodiments, and features described above, further aspects, embodiments, and features will become apparent by reference to the drawings and the following detailed description.

BRIEF DESCRIPTION OF THE DRAWINGS

In the detailed description that follows, embodiments are described as illustrations only since various changes and modifications will become apparent to those skilled in the art from the following detailed description. The use of the same reference numbers in different figures indicates similar or identical items.

DETAILED DESCRIPTION

Figure 1:
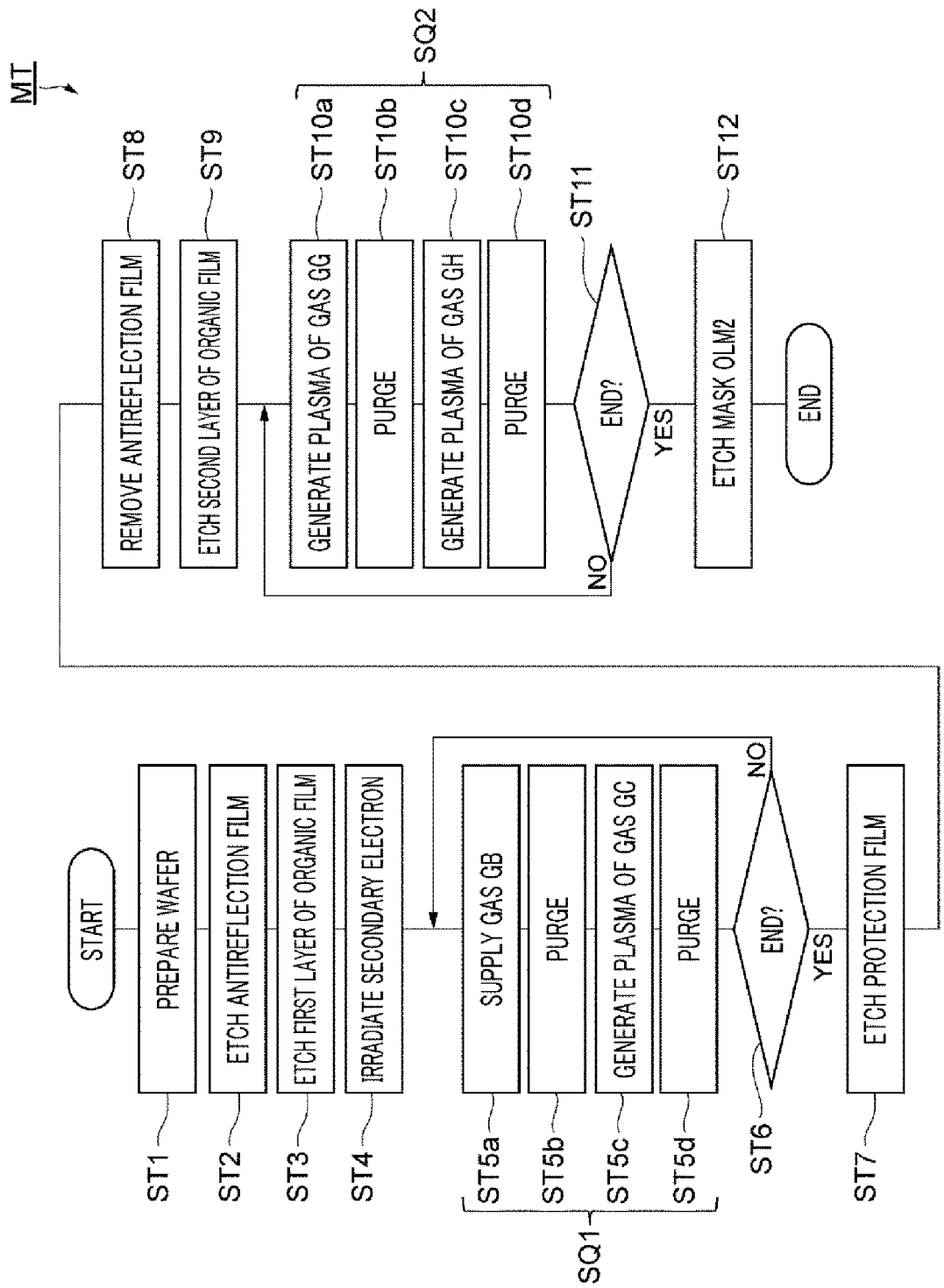
FIG. 1 is a flowchart for describing a method according to an exemplary embodiment.

In the following detailed description, reference is made to the accompanying drawings, which form a part of the description. In the drawings, similar symbols typically identify similar components, unless context dictates otherwise. Furthermore, unless otherwise noted, the description of each successive drawing may reference features from one or more of the previous drawings to provide clearer context and a more substantive explanation of the current exemplary embodiment. Still, the exemplary embodiments described in the detailed description, drawings, and claims are not meant to be limiting. Other embodiments may be utilized, and other changes may be made, without departing from the spirit or scope of the subject matter presented herein. It will be readily understood that the aspects of the present disclosure, as generally described herein and illustrated in the drawings, may be arranged, substituted, combined, separated, and designed in a wide variety of different configurations, all of which are explicitly contemplated herein.

Hereinafter, various exemplary embodiments will be described in detail with reference to the accompanying drawings. Same or corresponding parts in the various drawings will be assigned same reference numerals.

FIG. 1 is a flowchart for describing a method according to an exemplary embodiment. A method MT according to the exemplary embodiment shown in FIG. 1 is a method of processing a target object (hereinafter, referred to as "wafer"). The method MT, as shown in FIG. 1, includes processes ST1 to ST4, a sequence SQ1 (first sequence), processes ST6 to ST9, a sequence SQ2 (second sequence) and processes ST11 and ST12. The sequence SQ1 includes processes ST5a to ST5d. The sequence SQ2 includes processes ST10a to ST10d. Further, though the method MT of the present exemplary embodiment can be performed by using a single plasma processing apparatus (plasma processing apparatus 10 to be described later), it may be also possible to use a plurality of plasma processing apparatuses 10 for the individual processes of the method MT.

Figure 2:
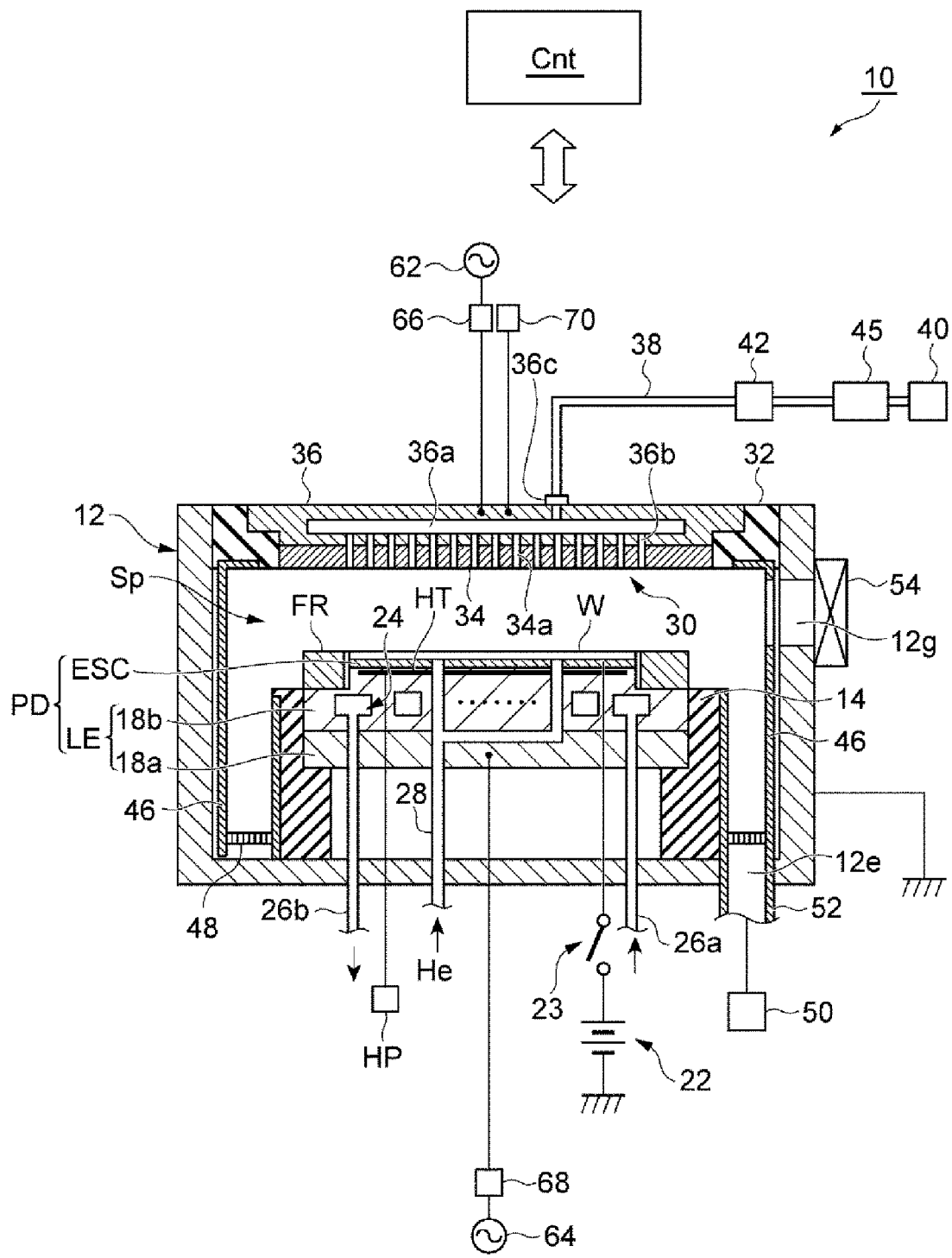
FIG. 2 is a diagram illustrating an example of a plasma processing apparatus.

FIG. 2 is a diagram showing an example of a plasma processing apparatus. FIG. 2 schematically illustrates a cross sectional structure of the plasma processing apparatus 10 which can be used in various exemplary embodiments of a method for processing a target object. As depicted in FIG. 2, the plasma processing apparatus 10 is a capacitively coupled plasma processing apparatus.

The plasma processing apparatus 10 includes a processing vessel 12, an exhaust opening 12e, a carry-in/out opening 12g, a supporting member 14, a placing table PD, a DC power supply 22, a switch 23, a coolant path 24, a pipeline 26a, a pipeline 26b, an upper electrode 30, an insulating shield member 32, an electrode plate 34, a gas discharge holes 34a, an electrode supporting body 36, a gas diffusion space 36a, gas through holes 36b, a gas inlet opening 36c, a gas supply line 38, a gas source group 40, a valve group 42, a flow rate controller group 45, a deposition shield 46, a gas exhaust plate 48, a gas exhaust device 50, a gas exhaust line 52, a gate valve 54, a first high frequency power supply 62, a second high frequency power supply 64, a matching device 66, a matching device 68, a power supply 70, a control unit Cnt, a focus ring FR, a heater power supply HP, and a heater HT. The placing table PD is equipped with an electrostatic chuck ESC and a lower electrode LE. The lower electrode LE includes a first plate 18a and a second plate 18b. The processing vessel 12 forms a processing space Sp therein.

The processing vessel 12 has a substantially cylindrical shape. The processing vessel 12 is made of, for example, aluminum. An inner wall surface of the processing vessel 12 is anodically oxidized. The processing vessel 12 is frame-grounded.

The supporting member 14 is provided on a bottom portion of the processing vessel 12 inside the processing vessel 12. The supporting member 14 has a substantially cylindrical shape. The supporting member 14 is made of, by way of example, an insulating material. The insulating material forming the supporting member 14 may be, for example, quartz. Within the processing vessel 12, the supporting member 14 is vertically extended from the bottom portion of the processing vessel 12.

The placing table PD is provided within the processing vessel 12. The placing table PD is supported by the supporting member 14. The placing table PD holds a wafer W on a top surface thereof. The wafer W is the target object. The placing table PD is equipped with the lower electrode LE and the electrostatic chuck ESC.

The lower electrode LE includes the first plate 18a and the second plate 18b. The first plate 18a and the second plate 18b are made of a metal such as, but not limited to, aluminum. The first plate 18a and the second plate 18b have a substantially disc shape. The second plate 18b is provided on the first plate 18a and electrically connected to the first plate 18a.

The electrostatic chuck ESC is provided on the second plate 18b. The electrostatic chuck ESC has a pair of insulating layers or insulating sheets; and an electrode, which serves as a conductive film, embedded therebetween. The electrode of the electrostatic chuck ESC is electrically connected to the DC power supply 22 via the switch 23. The electrostatic chuck ESC attracts the wafer W by an electrostatic force such as a Coulomb force generated by a DC voltage applied from the DC power supply 22. With this configuration, the electrostatic chuck ESC is capable of holding the wafer W.

The focus ring FR is placed on a peripheral portion of the second plate 18b to surround an edge of the wafer W and the electrostatic chuck ESC. The focus ring FR is configured to improve etching uniformity. The focus ring FR is made of a material which is appropriately selected depending on a material of an etching target film. By way of example, the focus ring FR may be formed of quartz.

The coolant path 24 is provided within the second plate 18b. The coolant path 24 constitutes a temperature controller. A coolant is supplied into the coolant path 24 from a chiller unit provided outside the processing vessel 12 via the pipeline 26a. The coolant supplied into the coolant path 24 is then returned back into the chiller unit via the pipeline 26b. In this way, the coolant is supplied into the coolant path 24 to be circulated therein. A temperature of the wafer W held by the electrostatic chuck ESC is controlled by adjusting a temperature of the coolant. Through the gas supply line 28, a heat transfer gas, e.g., a He gas, is supplied from a heat transfer gas supply device into a gap between a top surface of the electrostatic chuck ESC and a rear surface of the wafer W.

The heater HT is a heating device. By way of non-limiting example, the heater HT is buried in the second plate 18b. The heater HT is connected to a heater power supply HP. As a power is supplied to the heater HT from the heater power supply HP, a temperature of the placing table PD is adjusted, so that a temperature of the wafer W placed on the placing table PD is adjusted. Further, the heater HT may be embedded in the electrostatic chuck ESC.

The upper electrode 30 is provided above the placing table PD, facing the placing table PD. The lower electrode LE and the upper electrode 30 are arranged to be substantially parallel to each other. Provided between the upper electrode 30 and the lower electrode LE is the processing space Sp in which a plasma processing is performed on the wafer W.

The upper electrode 30 is supported at an upper portion of the processing vessel 12 with the insulating shield member 32 therebetween. The insulating shield member 32 is made of an insulating material such as, but not limited to, quartz.

The upper electrode 30 may include the electrode plate 34 and the electrode supporting body 36. The electrode plate 34 faces the processing space Sp, and is provided with a multiple number of gas discharge holes 34a. In the exemplary embodiment, the electrode plate 34 may be made of silicon.

The electrode supporting body 36 is configured to support the electrode plate 34 in a detachable manner, and is made of a conductive material such as, but not limited to, aluminum. The electrode supporting body 36 may have a water-cooling structure. The gas diffusion space 36a is formed within the electrode supporting body 36. The multiple gas through holes 36b are extended downwards (towards the placing table PD) from the gas diffusion space 36a, and these gas through holes 36b respectively communicate with the gas discharge holes 34a.

Through the gas inlet opening 36c, a processing gas is introduced into the gas diffusion space 36a. This gas inlet opening 36c is provided at the electrode supporting body 36 and connected with the gas supply line 38.

The gas source group 40 is connected to the gas supply line 38 via the valve group 42 and the flow rate controller group 45. The gas source group 40 includes a plurality of gas sources. These gas sources may include a source of an aminosilane-based gas, a source of an oxygen gas, a source of a hydrogen gas, a source of a nitrogen gas, a source of a carbon dioxide gas, a source of a fluorocarbon gas (hydrofluorocarbon gas), a source of a chlorine gas, and a source of a rare gas. As the aminosilane-based gas (which is contained in a gas GB to be described later), one having a molecular structure with a relatively small number of amino groups may be used. By way of non-limiting example, monoaminosilane ($H_3$—Si—R (R denotes an amino group which contains an organic group and may be substituted)) may be used. The aforementioned aminosilane-based gas (which is contained in the gas GB to be described later) may include aminosilane having one to three silicon atoms and aminosilane having one to three amino groups. The aminosilane having the one to three silicon atoms may be monosilane (monoaminosilane) having one to three amino groups, disilane having one to three amino groups, or trisilane having one to three amino groups. Further, the aforementioned aminosilane may have an amino group which may be substituted. The amino group may be substituted with any one of a methyl group, an ethyl group, a propyl group or a butyl group. Furthermore, the aforementioned methyl group, the ethyl group, the propyl group or the butyl group may be substituted with a halogen. The fluorocarbon gas may be implemented by, by way of example, but not limitation, a $CF_4$ gas, a $C_4F_6$ gas, a $C_4F_8$ gas, or the like. Further, the rare gas may be implemented by a He gas, an Ar gas, or the like.

The valve group 42 includes a multiple number of valves, and the flow rate controller group 45 includes a multiple number of flow rate controllers such as mass flow controllers. Each of the gas sources belonging to the gas source group 40 is connected to the gas supply line 38 via each corresponding valve belonging to the valve group 42 and each corresponding flow rate controller belonging to the flow rate controller group 45. Accordingly, in the plasma processing apparatus 10, it is possible to supply a gas from one or more gas sources selected from the plurality of gas sources belonging to the gas source group 40 into the processing vessel 12 at individually controlled flow rate(s). Further, in the plasma processing apparatus 10, a deposition shield 46 is provided along an inner wall of the processing vessel 12 in a detachable manner. The deposition shield 46 is also provided on an outer side surface of the supporting member 14. The deposition shield 46 is configured to suppress an etching byproduct (deposit) from adhering to the processing vessel 12, and is formed by coating an aluminum member with $Y_2O_3$ or the like.

At a bottom side of the processing vessel 12, the gas exhaust plate 48 is provided between the supporting member 14 and a side wall of the processing vessel 12. The gas exhaust plate 48 may be made of, by way of example, an aluminum member coated with $Y_2O_3$ or the like. The gas exhaust opening 12e is provided in the processing vessel 12 under the gas exhaust plate 48. The gas exhaust opening 12e is connected with the gas exhaust device 50 via the gas exhaust line 52. The gas exhaust device 50 includes a vacuum pump such as a turbo molecular pump, and is capable of decompressing the space within the processing vessel 12 to a required vacuum level. Through the carry-in/out opening 12g, the wafer W is carried into or out of the processing vessel 12. The carry-in/out opening 12g is provided at the side wall of the processing vessel 12, and the carry-in/out opening 12g is opened or closed by the gate valve 54.

The first high frequency power supply 62 is configured to generate a first high frequency power for plasma generation, for example, a high frequency power of 40 MHz having a frequency ranging from 27 MHz to 100 MHz. The first high frequency power supply 62 is connected to the upper electrode 30 via the matching device 66. The matching device 66 is a circuit configured to match an output impedance of the first high frequency power supply 62 and an input impedance at a load side (lower electrode LE side). The first high frequency power supply 62 may be connected to the lower electrode LE via the matching device 66.

The second high frequency power supply 64 is configured to generate a second high frequency power for attracting ion into the wafer W, that is, a high frequency bias power. By way of example, the second high frequency power supply 64 generates a high frequency bias power of 3.2 MHz having a frequency ranging from 400 kHz to 40.68 MHz. The second high frequency power supply 64 is connected to the lower electrode LE via a matching device 68. The matching device 68 is a circuit configured to match an output impedance of the second high frequency power supply 64 and the input impedance at the load side (lower electrode LE side). Further, the power supply 70 is connected to the upper electrode 30. The power supply 70 is configured to apply, to the upper electrode 30, a voltage for attracting positive ions within the processing space Sp into the electrode plate 34. As an example, the power supply 70 is a DC power supply configured to generate a negative DC Voltage. If such a voltage is applied to the upper electrode 30 from the power supply 70, the positive ions existing within the processing space Sp collide with the electrode plate 34. As a result, secondary electrons and/or silicon is released from the electrode plate 34.

The control unit Cnt is implemented by a computer including a processor, a storage unit, an input device, a display device, and so forth, and is configured to control individual components of the plasma processing apparatus 10. To elaborate, the control unit Cnt is connected to the valve group 42, the flow rate controller group 45, the gas exhaust device 50, the first high frequency power supply 62, the matching device 66, the second high frequency power supply 64, the matching device 68, the power supply 70, the heater power supply HP and the chiller unit.

The control unit Cnt is operated to output control signals according to a program based on an input recipe. The selection of the gas supplied from the gas source group and a flow rate of the selected gas, the gas exhaust of the gas exhaust device 50, power supplies from the first and second high frequency power supplies 62 and 64, application of the voltage from the power supply 70, the power supply of the heater power supply HP, the control of the flow rate and the temperature of the coolant from the chiller unit can be achieved in response to the control signals from the control unit Cnt. Further, individual processes of the method MT (shown in FIG. 1) of processing a target object according to the present exemplary embodiment can be performed as the individual components of the plasma processing apparatus 10 are operated under the control of the control unit Cnt.

Figure 3A:
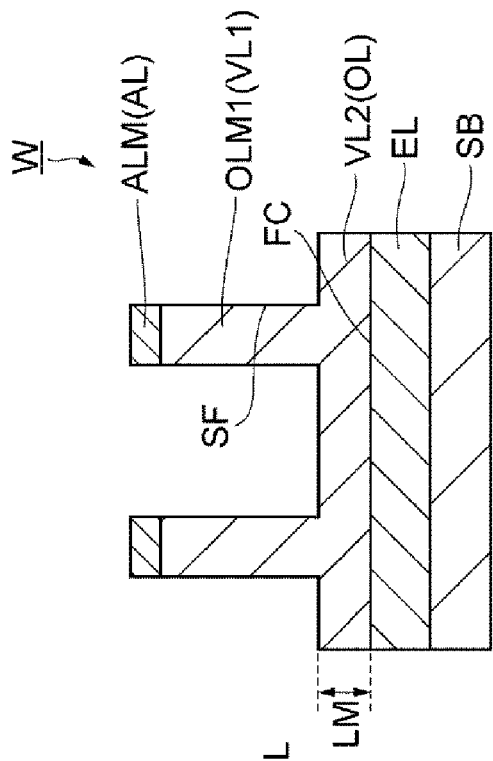
FIG. 3A is a cross sectional view illustrating a state of a target object before major processes shown in FIG. 1 are performed.
Figure 3B:
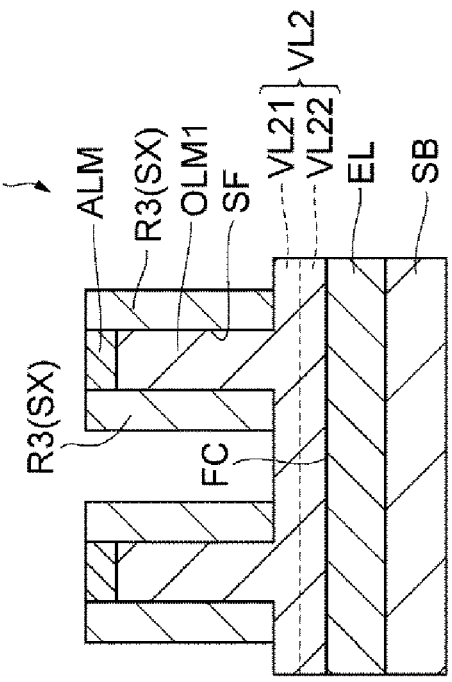
FIG. 3B to FIG. 3D are cross sectional views illustrating states of the target object after the major processes shown in FIG. 1 are performed.
Figure 3C:
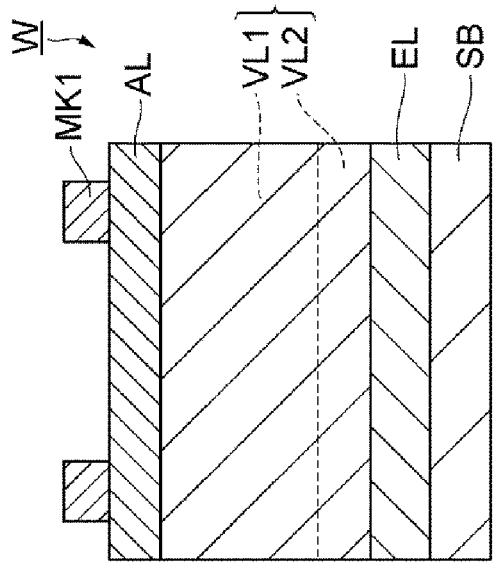
Figure 3D:
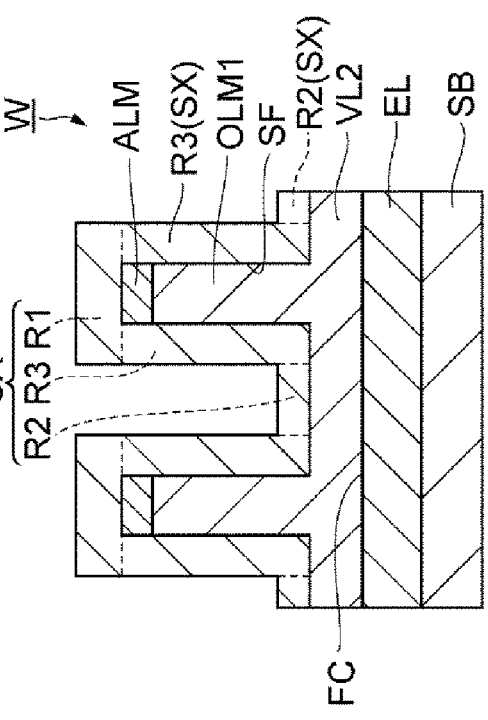
Figure 4A:
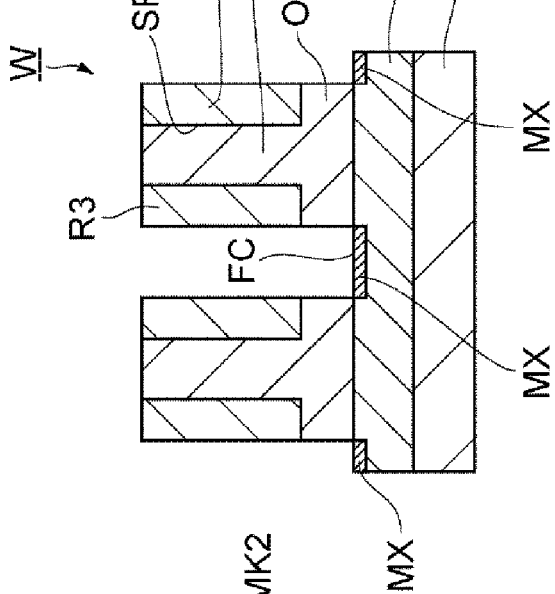
FIG. 4A to FIG. 4D are cross sectional views illustrating states of the target object after the major processes shown in FIG. 1 are performed.
Figure 4B:
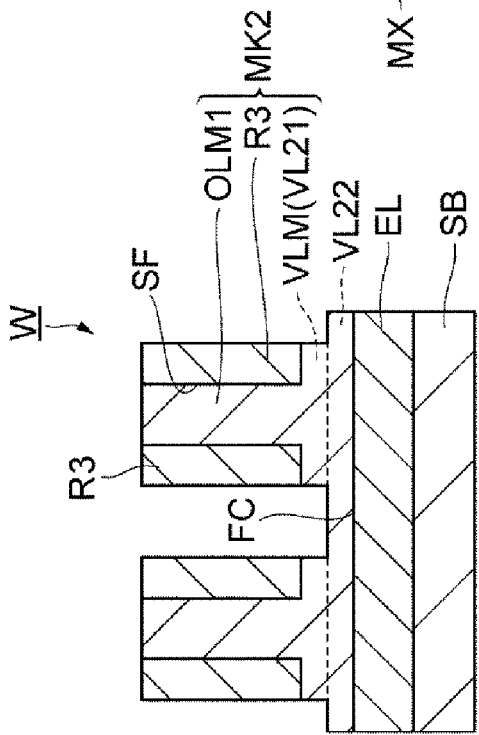
Figure 4C:
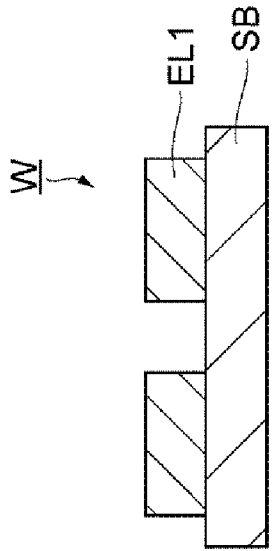
Figure 4D:
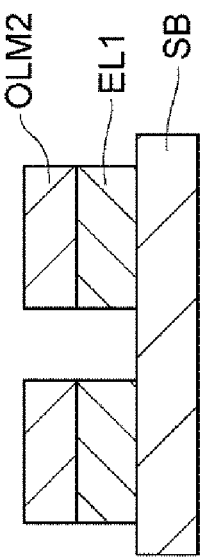
Figure 5A:
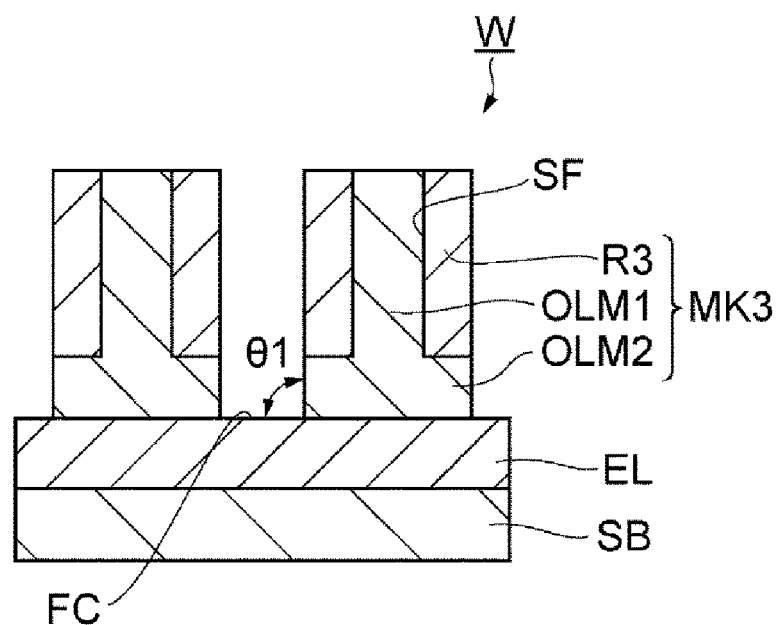
FIG. 5A and FIG. 5B are diagrams for describing an effect of the method according to the present exemplary embodiment.
Figure 5B:
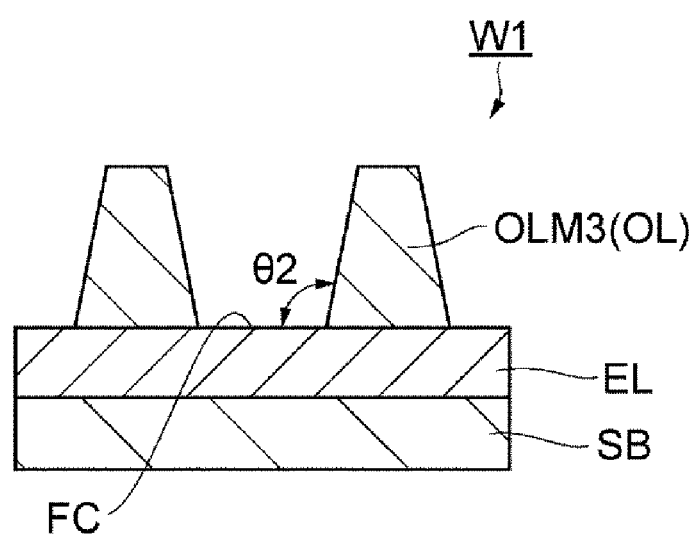
Figure 6A:
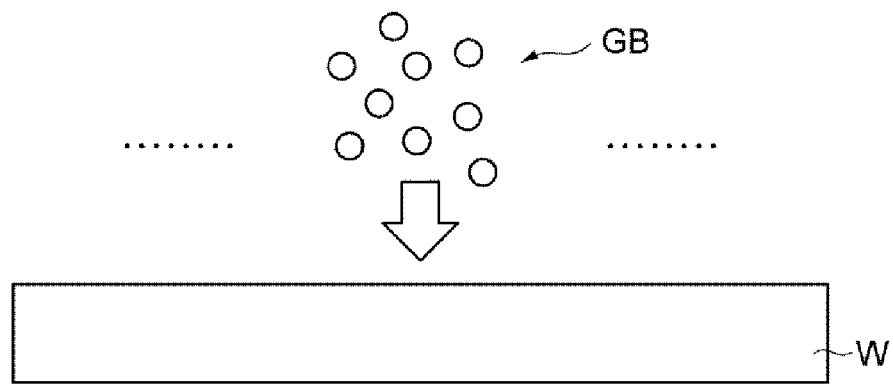
FIG. 6A to FIG. 6C are diagrams schematically illustrating film formation by performing a sequence shown in FIG. 1.
Figure 6B:
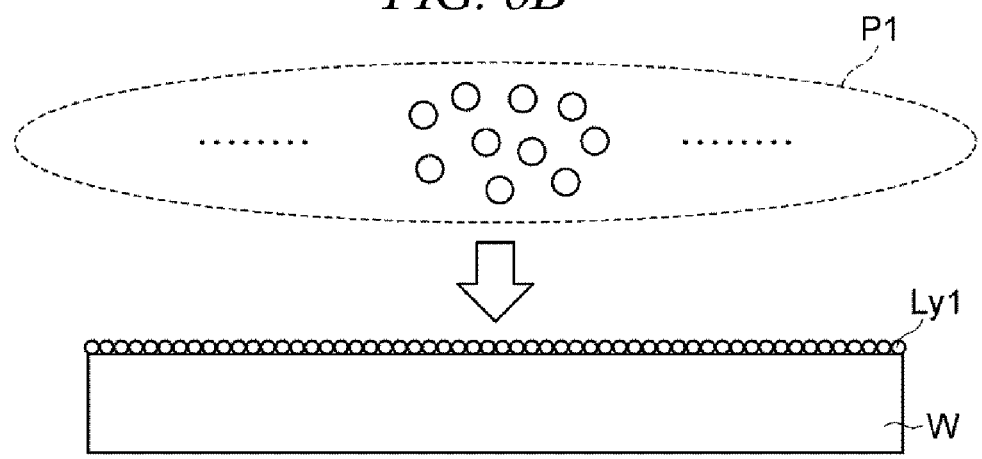
Figure 6C:
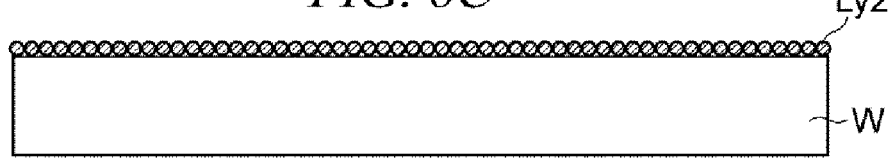
Figure 7C:
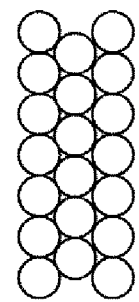
FIG. 7A to FIG. 7C are diagrams for describing a principle of etching in the method shown in FIG. 1.
Figure 7B:
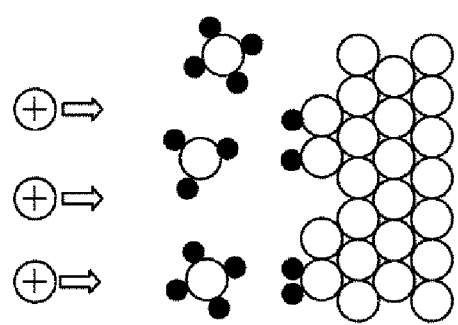
Figure 7A:
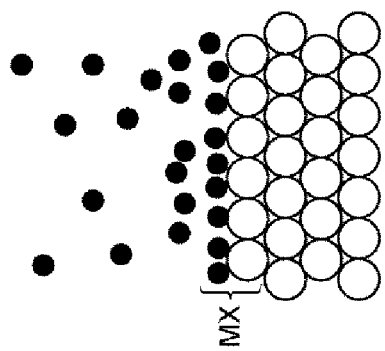

Now, the method MT according to the exemplary embodiment will be discussed in detail with reference to FIG. 1. The following description refers to FIG. 3A to FIG. 7B as well as FIG. 1 and FIG. 2. FIG. 3A is a cross sectional view illustrating a state of a target object before major processes shown in FIG. 1 are performed. FIG. 3B to FIG. 3D are cross sectional views illustrating states of the target object after the major processes shown in FIG. 1 are performed. FIG. 4A to FIG. 4D are cross sectional views illustrating states of the target object after the major processes shown in FIG. 1 are performed. FIG. 5A and FIG. 5B are diagrams for describing an effect of the method MT according to the exemplary embodiment. FIG. 6A to FIG. 6C are diagrams schematically illustrating film formation by performing a sequence shown in FIG. 1. FIG. 7A to FIG. 7C are diagrams for describing a principle of etching in the method MT shown in FIG. 1.

In a process ST1, a wafer W shown in FIG. 3A is prepared as the wafer W shown in FIG. 2. In the process ST1, the wafer W shown in FIG. 3A is prepared, and this wafer W is accommodated in the processing vessel 12 of the plasma processing apparatus 10 and placed on the placing table PD. The wafer W prepared in the process ST1 includes, as illustrated in FIG. 3A, a substrate SB, an etching target layer EL, an organic film OL, an antireflection film AL and a mask MK1.

The etching target layer EL is provided on the substrate SB. The etching target layer EL is made of a material which is selectively etched against the organic film OL, and may be implemented by an insulating film. The etching target layer EL may be made of, by way of example, but not limitation, silicon oxide ($SiO_2$). Further, the etching target layer EL may be made of another material such as polycrystalline silicon, silicon nitride (SiN), or the like.

The organic film OL is provided on the etching target layer EL. The organic film OL is a layer containing, for example, carbon or silicon, and may be implemented by a SOH (Spin On Hard mask) layer. Here, however, the material of the organic film OL is not limited to the mentioned SOH as long as the material can be selectively etched against a material (silicon oxide film) of a protection film SX to be described later. By way of example, besides the SOH, the material of the organic film OL may be SiN, polycrystalline silicon, amorphous silicon, or the like. The antireflection film AL contains silicon, and is provided on the organic film OL.

Further, in the following description, the organic film OL is divided into a first layer VL1 and a second layer VL2 for the convenience of explanation. That is, it is assumed that the organic film OL consists of the first layer VL1 and the second layer VL2. Here, however, it should be noted that a boundary between the first layer VL1 and the second layer VL2 is not physical but imaginary. The first layer VL1 and the second layer VL2 are made of the same material and extended along a surface of the wafer W. The second layer VL2 has a thickness LM. A thickness LM of the second layer VL2 is in a range from, for example, 10 nm to 20 nm. The antireflection film AL is provided on the first layer VL1. The first layer VL1 is provided on the second layer VL2, and the second layer VL2 is provided on the etching target layer EL. The second layer VL2 is provided on the etching target layer EL (that is, on a surface FC of the etching target layer EL). Further, after a process ST2 to be described later, a mask ALM formed through the process ST2 is provided on the organic film OL (specifically, on the first layer VL1).

The mask MK1 is provided on the antireflection film AL. The mask MK1 is a resist mask made of a resist material and is produced by patterning a resist layer through a photolithography technique. The mask MK1 partially covers the antireflection film AL. The mask MK1 is provided with an opening (pattern) through which the antireflection film AL is partially exposed. The pattern of the mask MK1 is, for example, a line-and-space pattern. The mask MK1 may have a pattern which provides a circular opening when viewed from the top. Alternatively, the mask MK1 may have a pattern which provides an elliptical opening when viewed from the top.

In the process ST2 after the process ST1, the antireflection film AL is etched. To elaborate, a gas containing a fluorocarbon gas is supplied into the processing vessel 12 as a processing gas from a gas source selected from the plurality of gas sources belonging to the gas source group 40. Then, a high frequency power is supplied from the first high frequency power supply 62, and a high frequency bias power is supplied from the second high frequency power supply 64. By operating the gas exhaust device 50, an internal pressure of the processing vessel 12 is set to a preset pressure. Accordingly, plasma of the processing gas containing the fluorocarbon gas is generated. Fluorine-containing active species in the generated plasma etches a region of the antireflection film AL exposed through the mask MK1. As a result, the mask ALM is formed from the antireflection film AL. The mask ALM is used as a mask for etching the organic film OL.

In a process ST3 after the process ST2, plasma of a gas GA (first gas) is generated within the processing vessel 12 of the plasma processing apparatus 10 in which the wafer W is accommodated. Then, by using this generated plasma and the mask ALM, the first layer VL1 is etched until the second layer VL2 is exposed, so that a mask OLM1 is formed from the first layer VL1 to be described later. To be more specific, the gas GA is supplied into the processing vessel 12 as a processing gas from a gas source selected from the plurality of gas sources belonging to the gas source group 40. The gas GA may contain a hydrogen gas and a nitrogen gas. Then, the high frequency power is supplied from the first high frequency power supply 62, and the high frequency bias power is supplied from the second high frequency power supply 64. By operating the gas exhaust device 50, the internal pressure of the processing vessel 12 is set to a preset pressure. Accordingly, the plasma of the gas GA is generated within the processing space Sp of the processing vessel 12. Hydrogen radicals as active species of hydrogen in the generated plasma etch a region of an entire region of the first layer VL1 exposed through the mask ALM. Further, a series of processes from ST3 to ST7 are performed to form a protection film SX conformally, by performing a sequence SQ1 repeatedly, on a side surface of the first layer VL1 which is formed by an etching in the process ST3 (specifically, on a side surface SF of the mask OLM1 formed through the process ST3). FIG. 3B to FIG. 3D illustrate states of the wafer W after the individual processes are performed.

In the process ST3, as depicted in FIG. 3B, the first layer VL1 of the organic film OL is etched, that is, the organic film OL is etched such that a thickness from an interface between the organic film OL and the etching target layer EL (i.e., from the surface FC of the etching target layer EL) reaches the thickness LM. That is, in the process ST3, the organic film OL is etched such that only a part of the organic film OL corresponding to the thickness LM is left, that is, such that the second layer VL2 is left. Through the process ST3, the mask OLM1 is formed from the first layer VL1. The mask OLM1 is provided on the second layer VL2. The mask ALM and the mask OLM1 are used as a mask for etching the second layer VL2. Further, since the protection of the side surface of the first layer VL1 and the etching of the first layer VL1 can be achieved at the same time by using the gas GA containing the hydrogen gas and the nitrogen gas, a high verticality of the mask OLM1 formed from the first layer VL1 through the process ST3 can be achieved.

In a process ST4 following the process ST3, by generating plasma within the processing vessel 12 and applying a negative DC voltage to the upper electrode 30 provided in the processing vessel 12, secondary ions are irradiated to a surface of the mask ALM and the side surface SF of the mask OLM1, and a protection film of silicon oxide is formed. The process ST4 is performed before conformally forming the protection film SX on the side surface SF of the mask OLM1 (that is, before the sequence SQ1 is performed) after the first layer VL1 of the organic film OL is etched until the second layer VL2 is exposed (that is, after the process ST3). Further, in the method MT, after the process ST3, the process ST4 may not be performed but a process ST5a (sequence SQ1) may be performed.

Following the process ST4, in the method MT shown in FIG. 1, the sequence SQ1 is performed one (unit cycle) or more times after the first layer VL1 is etched until the second layer VL2 is exposed (upon completion of the process ST4). Through a series of processes from the start of the sequence SQ1 to a process ST7 to be described later, the protection film SX is conformally formed on the side surface SF of the mask OLM1 which is formed through the process ST3. The sequence SQ1 includes the process ST5a, a process ST5b, a process ST5c and a process ST5d.

First, in the process ST5a, a silicon-containing gas GB (third gas) is supplied into the processing vessel 12. The gas GB contains an aminosilane-based gas. The gas GB is supplied into the processing vessel 12 from a gas source selected from the plurality of gas sources belonging to the gas source group 40. The gas GB is an aminosilane-based gas such as, but not limited to, monoaminosilane ($H_3$—Si—R (R denotes an amino group)). In the process ST5a, plasma of the gas GB is not generated.

As shown in FIG. 6A, molecules of the gas GB adhere to the surface of the wafer W as reaction precursors. The molecules (monoaminosilane) of the gas GB adhere to the surface of the wafer W by chemical adsorption based on chemical bonding, and plasma is not used. Further, a gas other than the monoaminosilane may be used as long as the gas contains silicon and can be attached to the surface of the wafer W by the chemical bonding.

The monoaminosilane-based gas is selected as the gas GB because the chemical adsorption of the monoaminosilane can take place relatively easily since it has relatively high electronegativity and a molecular structure with polarity. A layer Ly1 (see FIG. 6B) formed as the molecules of the gas GB adhere to the surface of the wafer W comes into a state close to a monomolecular layer (monolayer) since the adhesion is achieved by the chemical adsorption. Here, the smaller the amino group R of the monoaminosilane is, the smaller the molecular structure of the molecules adsorbed to the surface of the wafer W may be and, thus, steric hindrance which depends on the size of the molecules may be reduced. Therefore, the molecules of the gas GB can be uniformly adsorbed to the surface of the wafer W, so that the layer Ly1 can be formed to have a uniform film thickness on the surface of the wafer W. By way of example, as the monoaminosilane ($H_3$—Si—R) contained in the gas GB reacts with OH groups on the surface of the wafer W, $H_3$—Si—O as the reaction precursors are formed, so that the layer Ly1 formed of the monolayer of $H_3$—Si—O is obtained. Thus, the layer Ly1 of the reaction precursors is formed on the surface of the wafer W conformally to have a uniform thickness without being affected by a pattern density of the wafer W.

In the process ST5b following the process ST5a, the space within the processing vessel 12 is purged. To elaborate, the gas GB supplied in the process ST5a is exhausted. In the process ST5b, an inert gas such as a nitrogen gas may be supplied into the processing vessel 12 as a purge gas. That is, the purging in the process ST5b may be implemented by a gas purging of allowing the inert gas to flow in the processing vessel 12 or a purging by vacuum evacuation. In the process ST5b, surplus molecules adhering to the surface of the wafer W may be removed. Through the processes as stated above, the layer Ly1 of the reaction precursors is formed to be a very thin monolayer, as illustrated in FIG. 6B.

In the process ST5c following the process ST5b, plasma P1 of a gas GC (fourth gas) is generated within the processing vessel 12, as shown in FIG. 6B. To elaborate, the gas GC containing a carbon dioxide gas is supplied into the processing vessel 12 from a gas source selected from the plurality of gas sources belonging to the gas source group 40. The gas GC may be another gas containing an oxygen atom besides the carbon dioxide gas. By way of non-limiting example, the gas GC may be an oxygen gas. The high frequency power is supplied from the first high frequency power supply 62. At this time, the second high frequency power supply 64 may also apply the bias power. Further, it may be also possible to generate the plasma by using only the second high frequency power supply 64 without using the first high frequency power supply 62. By operating the gas exhaust device 50, the pressure of the space within the processing vessel 12 is set to a preset pressure.

The molecules (constituting the monolayer of the layer Ly1) adhering to the surface of the wafer W through the process ST5a as stated above includes a bond between silicon and hydrogen. A binding energy of the silicon and the hydrogen is lower than a binding energy of silicon and oxygen. Accordingly, if the plasma P1 of the gas GC containing the carbon dioxide gas is generated, active species of the oxygen, for example, oxygen radicals are generated, and the hydrogen of the molecules constituting the monolayer of the layer Ly1 is substituted with oxygen, so that a layer Ly2 of silicon oxide film is formed as a monolayer, as illustrated in FIG. 6C.

In the process ST5d following the process ST5c, the space within the processing vessel 12 is purged. To elaborate, the gas GC supplied in the process ST5c is exhausted. In the process ST5d, an inert gas such as a nitrogen gas may be supplied into the processing vessel 12 as a purge gas. That is, the purging in the process ST5d may be implemented by the gas purging of allowing the inert gas to flow in the processing vessel 12 or the purging by vacuum evacuation.

In the above-described sequence SQ1, the purging is performed in the process ST5*b*, and the hydrogen in the molecules constituting the layer Ly1 is substituted with the oxygen in the process ST5*c* following the process ST5*b*. Accordingly, the same as in an ALD method, by performing the single cycle of the sequence SQ1, the layer Ly2 of the silicon oxide film can be conformally formed on the surface of the wafer W (particularly, on the side surface SF of the mask OLM1) in a thin uniform film thickness regardless of denseness/sparseness of the pattern of the mask MK1. Further, though the process which is the same as the ALD method and is implemented by the above-stated sequence SQ1 may be the process performed within the same processing vessel 12, the exemplary embodiment is not limited thereto, and the wafer W may be carried out of the processing vessel 12 once and the process may be performed in another processing vessel 12.

In the process ST6 following the sequence SQ1, it is determined whether or not to finish the repetition of the sequence SQ1. To elaborate, in the process ST6, it is determined whether the repetition number of the sequence SQ1 has reached a preset number. Determining the repetition number of the sequence SQ1 is determining a thickness of the protection film SX, which is the silicon oxide film, formed on the wafer W (on the side surface SF of the mask OLM1) shown in FIG. 3C. That is, the thickness of the protection film SX finally formed on the wafer W is determined by a product of the film thickness of the silicon oxide film formed through a single cycle of the sequence SQ1 and the repetition number of the sequence SQ1. Accordingly, the repetition number of the sequence SQ1 is set based on the required thickness of the protection film SX formed on the wafer W.

If it is determined in the process ST6 that the repetition number of the sequence SQ1 has not reached the preset number (process ST6: NO), the sequence SQ1 is repeated. Meanwhile, if it is determined in the process ST6 that the repetition number of the sequence SQ1 has reached the preset number (process ST6: YES), the repetition of the sequence SQ1 is ended. As a result, the protection film SX, which is the silicon oxide film, is formed on the surface of the wafer W (particularly, on the side surface SF of the mask OLM1), as illustrated in FIG. 3C. That is, as the sequence SQ1 is repeated the preset number of times, the protection film SX having the preset thickness is conformally formed on the surface of the wafer W in the uniform film thickness regardless of the denseness/sparseness of the pattern of the mask MK1. The thickness of the protection film SX on the side surface SF of the mask OLM1 decreases as the repetition number of the sequence SQ1 is reduced.

The protection film SX includes, as depicted in FIG. 3C, a region R1, a region R2 and a region R3. The region R3 is extended on and along the side surface of the mask ALM and the side surface SF of the mask OLM1. The region R3 is extended from the surface of the mask OLM1 formed through the process ST3 to below the region R1. The region R1 is extended on the top surface of the mask ALM and on the region R3. The region R2 is located between adjacent regions R3 and is extended on the surface of the mask OLM1 formed through the process ST3. As stated above, as the sequence SQ1 is repeated, the protection film SX is formed in the same way as in the ALD method. Thus, film thicknesses of the region R1, the region R2 and the region R3 become substantially same regardless of the denseness/sparseness of the pattern of the mask MK1.

In the process ST7 following the process ST6 (process ST6: YES), the protection film SX is etched (etched back) to remove the region R1 and the region R2. In the process ST7, after the sequence SQ1 is performed repeatedly, plasma of a gas GD (fifth gas) is generated within the processing vessel 12, and the film (the region R2 of the protection film SX) formed on the surface of the second layer VL2 is removed by using the plasma. In the process ST7, the region R2 of the protection film SX is removed, and the region R1 thereof is also removed. For the removal of the regions R1 and R2, anisotropic etching condition is required. For this reason, in the process ST7, a processing gas containing the gas GD containing fluorine is supplied into the processing vessel 12 from a gas source selected from the plurality of gas sources belonging to the gas source group 40. The gas GD is a fluorine-containing gas and may be, for example, a fluorocarbon gas. The high frequency power is supplied form the first high frequency power supply 62. The high frequency bias power is supplied from the second high frequency power supply 64. By operating the gas exhaust device 50, the internal pressure of the space within the processing vessel 12 is set to a preset pressure. Accordingly, plasma of the fluorocarbon gas is generated. Fluorine-containing active species in the generated plasma are attracted in the vertical direction due to the high frequency bias power to etch the region R1 and the region R2 first. As illustrated in FIG. 3D, the region R1 and the region R2 are selectively etched through the process ST7, so that only the region R3 of the protection film SX is left. As the region R2 is removed, a surface of the second layer VL2 is exposed.

The thickness LM of the second layer VL2 is in the range from 10 nm to 20 nm before a process ST8 of removing the mask ALM as will be described later is performed. Further, in the following description, the second layer VL2 is divided into a third layer VL21 and a fourth layer VL22 for the convenience of explanation. That is, it is assumed that the second layer VL2 consists of the third layer VL21 and the fourth layer VL22. Here, however, it should be noted that a boundary between the third layer VL21 and the fourth layer VL22 is not physical but imaginary. The third layer VL21 and the fourth VL22 are made of the same material and extended along the surface of the wafer W.

In the process ST8 following the process ST7, plasma of a gas GE (second gas) is generated within the processing vessel 12, and the mask ALM is removed by being etched with this plasma. This process ST8 is conducted before performing a processing (a sequence SQ2 and a process ST11) of etching the etching target layer EL, specifically, before performing a processing (process ST9) of etching the second layer VL2 of the organic film OL until the etching target layer EL is exposed. To elaborate, as a processing gas, the gas GE from a gas source selected from the plurality of gas sources belonging to the gas source group 40 is supplied into the processing vessel 12. The gas GE contains fluorine or chlorine. The gas GE may be a mixed gas of a hydrofluorocarbon gas (e.g., a $CH_3F$ gas), an oxygen gas and a rare gas (e.g., an Ar gas). Alternatively, the gas GE may be a fluorocarbon gas (e.g., a $CF_4$ gas). Still alternatively, the gas GE may be a mixed gas of a chlorine gas, an oxygen gas and a rare gas (e.g., an Ar gas). The high frequency power is supplied from the first high frequency power supply 62, and the high frequency bias power is supplied from the second high frequency power supply 64. By operating the gas exhaust device 50, the pressure of the space within the processing vessel 12 is set to a preset pressure. As a result, the plasma of the gas GE is generated. Fluorine- or chlorine-containing active species in this generated plasma etch the mask ALM. Accordingly, as shown in FIG. 4A, the mask ALM is removed. Further, in the process ST8, the mask ALM is removed and the second layer VL2 is etched until the fourth layer VL22 is exposed. That is, through the process ST8, as shown in FIG. 3D and FIG. 4A, the third layer VL21 of the second layer VL2 is etched while the fourth layer VL22 of the second layer VL2 remains. The third layer VL21 becomes a mask VLM through the etching of the process ST8. The mask OLM1, the region R3 and the mask VLM constitute a mask MK2. The mask MK2 is used as a mask for etching the fourth layer VL22.

In the process ST9 following the process ST8, the fourth layer VL22 is etched by using the mask MK2 until the surface FC of the etching target layer EL is exposed, so that a mask OLM2 is formed. That is, the mask OLM2 is formed from the second layer VL2 through the process ST8 and the process ST9. The mask OLM2 includes the mask VLM. The mask OLM2 is provided on the surface FC of the etching target layer EL, and the mask OLM1 and the region R3 are provided on the mask OLM2. The mask OLM2 is provided between the mask OLM1 and the region R3 and the etching target layer EL. The mask OLM1, the region R3 and the mask OLM2 constitute a mask MK3. The mask MK3 is used as a mask for etching the etching target layer EL.

In the etching of the fourth layer VL22 in the process ST9, plasma of a gas GF (sixth gas) is generated within the processing vessel 12, and by using the generated plasma and the mask MK2, the second layer VL2 (specifically, the fourth layer VL22) is etched until the etching target layer EL is exposed, while maintaining the shape of the mask OLM1 formed after the etching in the process ST3. To elaborate, as a processing gas, the gas GF containing a mixed gas of a hydrogen gas and a nitrogen gas from a gas source selected from the plurality of gas sources belonging to the gas source group 40 is supplied into the processing vessel 12. The gas GF may include the nitrogen gas and the hydrogen gas. The high frequency power is supplied from the first high frequency power supply 62, and the high frequency bias power is supplied from the second high frequency power supply 64. By operating the gas exhaust device 50, the pressure of the space within the processing vessel 12 is set to a preset pressure. As a result, the plasma of the gas GF is generated. Active species in the generated plasma etch the fourth layer VL22. Accordingly, the fourth layer VL22 is etched as illustrated in FIG. 4B. Through the processes up to the process ST9, the second layer VL2 is etched, so that a mask OLM2 is obtained.

A side surface of the mask MK3 formed in the processes up to the process ST9 has sufficient verticality with respect to the surface FC of the etching target layer EL, as shown in FIG. 5A. An angle θ1 formed between the side surface of the mask MK3 and a region of the surface FC of the etching target layer EL connected to the corresponding side surface of the mask MK3 is a substantially right angle. This verticality of the mask MK3 is obtained as the side surface of the organic film OL (the mask OLM1) is protected by the region R3 included in the mask MK2 in the processes from the process ST8 to the process ST9, that is, by the protection film SX (the region R3), which is the silicon oxide film, formed on the side surface of the organic film OL through the sequence SQ1 and the process ST6. Meanwhile, as depicted in FIG. 5B, as a comparative example, if a mask OML3 is formed from an organic film OL as the organic film OL is etched after a mask ALM is removed on a wafer W1, in which a protection film such as a silicon oxide film is not formed on a side surface of the organic film OL, the side surface of the mask OLM3 has a tapered shape which is thinned toward a surface FC of an etching target layer EL and does not have sufficient verticality with respect to the surface FC of the etching target layer EL. That is, an angle θ2 formed between the side surface of the mask OLM3, formed from the organic film OL by the etching after the mask ALM is removed, and a region of the surface FC of the etching target layer EL connected to the corresponding side surface of the mask OLM3 is larger than the angle θ1 with respect to the side surface of the mask MK3. Thus, the verticality of the side surface of the mask MK3 with respect to the surface FC of the etching target layer EL can be achieved as the protection film SX (the region R3) protects the organic film OL (the mask OML1) in the etching of the process ST9 which is performed after the mask ALM is removed.

A series of processes from the sequence SQ2 to a process ST11 is performed after the process ST9. The series of processes from the sequence SQ2 to the process ST11 are performed to etch the etching target layer EL. In the series of processes from the sequence SQ2 to the process ST11, as the sequence SQ2 is repeated, every atomic layer of the etching target layer EL is removed so that the etching target layer EL is etched.

First, upon the completion of the process ST9, the sequence SQ2 is performed one (unit cycle) or more cycles. The sequence SQ2 is a series of processes of etching a region of the etching target layer EL, which is not covered with the mask MK3, with high accuracy and high selectivity regardless of denseness/sparseness of a pattern of the mask MK3 through the same method as an ALE (Atomic Layer Etching) method. The sequence SQ2 includes a process ST10a, a process ST10b, a process ST10c and a process ST10d which are performed in sequence.

In the process ST10a, plasma of a gas GG (seventh gas) is generated within the processing vessel 12, and a mixed layer MX containing radicals included in this plasma is formed on an atomic layer of the surface FC of the etching target layer EL, as illustrated in FIG. 4B. In the process ST10a, by supplying the gas GG into the processing vessel 12 in the state that the wafer W is placed on the electrostatic chuck ESC, the plasma of the gas GG is generated. The gas GG is an etchant gas suitable for the etching of the etching target layer EL containing the silicon, and contains a fluorocarbon-based gas, a rare gas and an oxygen gas. By way of example, the gas GG may be, but not limited to, $C_4F_6$/Ar/$O_2$ gas. To elaborate, the gas GG containing the $C_4F_6$/Ar/$O_2$ gas is supplied into the processing vessel 12 from a gas source selected from the plurality of gas sources belonging to the gas source group 40. Then, the high frequency power is supplied from the first high frequency power supply 62, and the high frequency bias power is supplied from the second high frequency power supply 64. By operating the gas exhaust device 50, the pressure of the space within the processing vessel 12 is set to a preset pressure. As a result, the plasma of the gas GG is generated within the processing vessel 12. The plasma of the gas GG contains carbon radicals and fluorine radicals.

FIG. 7A to FIG. 7C are diagrams showing a principle of the etching in the method (sequence SQ2) shown in FIG. 1. In FIG. 7A to FIG. 7C, white circles indicate atoms constituting the etching target layer EL; black circles indicate radicals; and encircled '+' marks indicate ions of atoms of a rare gas (for example, ions of an Ar atom) contained in a gas GH to be described later. As shown in FIG. 7A, through the process ST10a, the carbon radicals and the fluorine radicals contained in the plasma of the gas GG are supplied to the atomic layer of the surface of the etching target layer EL.

Accordingly, through the process ST10a, the mixed layer MX containing the atoms constituting the etching target layer EL, the carbon radicals and the fluorine radicals is formed on the atomic layer of the surface of the etching target layer EL.

As stated above, since the gas GG contains the fluorocarbon-based gas, the fluorine radicals and the carbon radicals are supplied to the atomic layer of the surface FC of the etching target layer EL in the process ST10a, so that the mixed layer MX containing both radicals can be formed on the atomic layer of the surface FC. Here, the amount of the fluorine radicals can be controlled by a DC voltage from the power supply 70.

In the process ST10b following the process ST10a, the space within the processing vessel 12 is purged. To elaborate, the gas GG supplied in the process ST10a is exhausted. In the process ST10b, an inert gas such as a nitrogen gas or a rare gas (e.g., an Ar gas) may be supplied into the processing vessel 12 as a purge gas. That is, the purging in the process ST10b may be implemented by the gas purging of allowing the inert gas to flow in the processing vessel 12 or the purging by vacuum evacuation.

In the process ST10c following the process ST10b, plasma of the gas GH (eighth gas) is generated within the processing vessel 12, and the mixed layer MX is removed by applying a bias voltage to the plasma. The gas GH contains a rare gas, for example, an Ar gas. To elaborate, the gas GH containing the rare gas (e.g., the Ar gas) is supplied into the processing vessel 12 from a gas source selected from the plurality of gas sources belonging to the gas source group 40. The high frequency power is supplied from the first high frequency power supply 62, and the high frequency bias power is supplied from the second high frequency power supply 64. By operating the gas exhaust device 50, the pressure of the space within the processing vessel 12 is set to a preset pressure. As a result, the plasma of the gas GH is generated within the processing vessel 12. Ions of atoms of the gas GH (for example, ions of Ar atoms) in the generated plasma collide with the mixed layer MX on the surface FC of the etching target layer EL by being attracted in the vertical direction by the high frequency bias power and supply energy to the mixed layer MX. As depicted in FIG. 7B, through the process ST10c, the energy is supplied to the mixed layer MX formed on the surface FC of the etching target layer EL through the ions of the atoms of the gas GH, and the mixed layer MX can be removed from the etching target layer EL by this energy.

As stated above, since the gas GH contains the rare gas, in the process ST10c, the mixed layer MX formed on the surface FC of the etching target layer EL can be removed from the surface FC by the energy that the plasma of the rare gas receives from the bias voltage.

In the process ST10d following the process ST10c, the space within the processing vessel 12 is purged. To elaborate, the gas GH supplied in the process ST10c is exhausted. In the process ST10d, an inert gas such as a nitrogen gas or a rare gas (e.g., an Ar gas) may be supplied into the processing vessel 12 as a purge gas. That is, the purging in the process ST10d may be implemented by the gas purging of allowing the inert gas to flow in the processing vessel 12 or the purging by vacuum evacuation. As illustrated in FIG. 7C, by the purging performed in the process ST10d, the atoms constituting the mixed layer MX on the surface FC of the etching target layer EL and surplus ions (e.g., ions of Ar atoms) contained in the plasma of the gas GH can be sufficiently removed.

In the process ST11 following the sequence SQ2, it is determined whether or not to finish the repetition of the sequence SQ2. To elaborate, in the process ST11, it is determined whether the repetition number of the sequence SQ2 has reached a preset number. Determining the repetition number of the sequence SQ2 is determining a degree (depth) of the etching of the etching target layer EL. The sequence SQ2 may be repeated such that the etching target layer EL is etched until the surface of the substrate SB is exposed. That is, the repetition number of the sequence SQ2 may be determined such that a product of a thickness of the etching target layer EL etched by performing the sequence SQ2 one time (unit cycle) and the repetition number of the sequence SQ2 becomes a total thickness of the etching target layer EL itself. Accordingly, the repetition number of the sequence SQ2 may be set based on the thickness of the etching target layer EL.

If it is determined in the process ST11 that the repetition number of the sequence SQ2 has not reached the preset number (process ST11: NO), the sequence SQ2 is repeated again. Meanwhile, if it is determined in the process ST11 that the repetition number of the sequence SQ2 has reached the preset number (process ST11: YES), the repetition of the sequence SQ2 is ended. As a result, the etching target layer EL is etched, and a pattern EL1 is formed, as shown in FIG. 4C. The pattern EL1 is provided on the surface of the substrate SB. The pattern EL1 is provided between the substrate SB and the mask OLM2. That is, as the sequence SQ2 is repeated the preset number of times, the etching target layer EL is etched with high accuracy and high selectivity regardless of denseness/sparseness of the pattern of the mask MK3 (the mask MK1).

Further, the etching target layer EL is etched through the series of processes of the sequence SQ2 and the process ST11. Further, the mask OLM1 and the region R3 of the mask MK3 are removed by the etching, and the mask OLM2 is left, as shown in FIG. 4C.

In a process ST12 following the process ST11 (YES), plasma of a gas GI is generated within the processing vessel 12 of the plasma processing apparatus 10 in which the wafer W is accommodated, and with this plasma, the mask OLM2 of the mask MK3 remaining up to the process ST11 (process ST11: YES) is removed by etching. To elaborate, as a processing gas, the gas GI is supplied into the processing vessel 12 from a gas source selected from the plurality of gas sources belonging to the gas source group 40. The gas GI includes an oxygen gas. The high frequency power is supplied from the first high frequency power supply 62, and the high frequency bias power is supplied from the second high frequency power supply 64. By operating the gas exhaust device 50, the pressure of the space within the processing vessel 12 is set to a preset pressure. As a result, the plasma of the gas GI is generated in the processing space Sp of the processing vessel 12. Oxygen radicals as active species of oxygen in the generated plasma etch the mask OLM2. The antireflection film AL and the organic film OL are removed from the wafer W by the time the process ST12 is performed, so that the substrate SB and the pattern EL1 on the substrate SB remain on the wafer W, as depicted in FIG. 4D. The pattern EL1 is formed from the etching target layer EL through the process ST12.

Below, examples of major processing conditions of the processes ST2 to ST4, the process ST5a, the process ST5c, the processes ST7 to ST9, the process ST10a, the process ST10c, the process ST12, the sequence SQ1 and the sequence SQ2 are specified.

<Process ST2>
Internal pressure of processing vessel 12 [mTorr]: 50 [mTorr]
Value of high frequency power of first high frequency power supply 62 [W]: 500 [W]
Value of high frequency power of second high frequency power supply 64 [W]: 300 [W]
Value of DC voltage of power supply 70 [W]: 0 [V]
Processing gas: $CF_4$ gas
Flow rate of processing gas [sccm]: 600 [sccm]
Processing time [s]: 28 [s]
<Process ST3>
Internal pressure of processing vessel 12 [mTorr]: 20 [mTorr]
Value of high frequency power of first high frequency power supply 62 [W]: 500 [W]
Value of high frequency power of second high frequency power supply 64 [W]: 400 [W]
Value of DC voltage of power supply 70 [V]: 0 [V]
Processing gas (gas GA): $N_2/H_2$
Flow rate of processing gas [sccm]: ($N_2$ gas) 200 [sccm], ($H_2$ gas) 200 [sccm]
Processing time [s]: 40 [s]
<Process ST4>
Internal pressure of processing vessel 12 [mTorr]: 50 [mTorr]
Value of high frequency power of first high frequency power supply 62 [W]: 300 [W]
Value of high frequency power of second high frequency power supply 64 [W]: 0 [W]
Value of DC voltage of power supply 70 [V]: −900 [V]
Processing gas: $H_2$/Ar gas
Flow rate of processing gas [sccm]: ($H_2$ gas) 100 [sccm], (Ar gas) 800 [sccm]
Processing time [s]: 60 [s]
<Process ST5a>
Internal pressure of processing vessel 12 [mTorr]: 100 [mTorr]
Value of high frequency power of first high frequency power supply 62 [W]: 0 [W]
Value of high frequency power of second high frequency power supply 64 [W]: 0 [W]
Value of DC voltage of power supply 70 [V]: 0 [V]
Processing gas (gas GB): monoaminosilane ($H_3$—Si—R (R denote an amino group))
Flow rate of processing gas [sccm]: 50 sccm
Processing time [s]: 15 [s]
<Process ST5c>
Internal pressure of processing vessel 12 [mTorr]: 200 [mTorr]
Value of high frequency power of first high frequency power supply 62 [W]: 300 [W], 10 [kHz], Duty 50
Value of high frequency power of second high frequency power supply 64 [W]: 0 [W]
Value of DC voltage of power supply 70 [V]: 0 [V]
Processing gas (gas GC): $CO_2$ gas
Flow rate of processing gas [sccm]: 300 [sccm]
Processing time [s]: 5 [s] Further, in the process ST5c, the following processing is performed prior to performing the processing which is performed under the above-specified processing conditions.
Internal pressure of processing vessel 12 [mTorr]: 0 [mTorr]
Value of high frequency power of first high frequency power supply 62 [W]: 0 [W]
Value of high frequency power of second high frequency power supply 64 [W]: 0 [W]
Value of DC voltage of power supply 70 [V]: 0 [V]
Processing gas (gas GC): $CO_2$ gas
Flow rate of processing gas [sccm]: 300 [sccm]
Processing time [s]: 10 [s]
<Process ST7>
Internal pressure of processing vessel 12 [mTorr]: 20 [mTorr]
Value of high frequency power of first high frequency power supply 62 [W]: 100 [W]
Value of high frequency power of second high frequency power supply 64 [W]: 100 [W]
Value of DC voltage of power supply 70 [V]: 0 [V]
Processing gas (gas GD): $CF_4$/Ar gas
Flow rate of processing gas [sccm]: ($CF_4$ gas) 50 [sccm], (Ar gas) 300 [sccm]
Processing time [s]: 25 [s]
<Process ST8>
(Condition Cond1)
Internal pressure of processing vessel 12 [mTorr]: 50 [mTorr]
Value of high frequency power of first high frequency power supply 62 [W]: 100 [W]
Value of high frequency power of second high frequency power supply 64 [W]: 300 [W]
Value of DC voltage of power supply 70 [V]: 0 [V]
Processing gas (gas GE): $CH_3F/Ar/O_2$ gas
Flow rate of processing gas [sccm]: ($CH_3F$ gas) 40 [sccm], (Ar gas) 90 [sccm], ($O_2$ gas) 22 [sccm]
Processing time [s]: 45 [s]
Further, the example of the processing conditions of the process ST8 may include one of conditions Cond 2 and Cond 3 instead of the aforementioned condition Cond 1.
(Condition Cond2)
Internal pressure of processing vessel 12 [mTorr]: 100 [mTorr]
Value of high frequency power of first high frequency power supply 62 [W]: 500 [W]
Value of high frequency power of second high frequency power supply 64 [W]: 300 [W]
Value of DC voltage of power supply 70 [V]: 0 [V]
Processing gas (gas GE): $CF_4$ gas
Flow rate of processing gas [sccm]: 200 [sccm]
Processing time [s]: 30 [s]
(Condition Cond 3)
Internal pressure of processing vessel 12 [mTorr]: 200 [mTorr]
Value of high frequency power of first high frequency power supply 62 [W]: 100 [W]
Value of high frequency power of second high frequency power supply 64 [W]: 400 [W]
Value of DC voltage of power supply 70 [V]: 0 [V]
Processing gas (gas GE): $Cl_2/Ar/O_2$ gas
Flow rate of processing gas [sccm]: ($Cl_2$ gas) 70 [sccm], (Ar gas) 500 [sccm], ($O_2$ gas) 18 [sccm]
Processing time [s]: 30 [s]
<Process ST9>
Internal pressure of processing vessel 12 [mTorr]: 20 [mTorr]
Value of high frequency power of first high frequency power supply 62 [W]: 600 [W]
Value of high frequency power of second high frequency power supply 64 [W]: 400 [W]
Value of DC voltage of power supply 70 [V]: 0 [V]
Processing gas (gas GF): $N_2/H_2$ gas
Flow rate of processing gas [sccm]: ($N_2$ gas) 200 [sccm], ($H_2$ gas) 200 [sccm]
Processing time [s]: 15 [s]

<Process ST10a>
Internal pressure of processing vessel 12 [mTorr]: 30 [mTorr]
Value of high frequency power of first high frequency power supply 62 [W]: 100 [W]
Value of high frequency power of second high frequency power supply 64 [W]: 350 [W]
Value of DC voltage of power supply 70 [V]: 0 [V]
Processing gas (gas GG): $C_4F_6/Ar/O_2$ gas
Flow rate of processing gas [sccm]: ($C_4F_6$ gas) 4(5) [sccm], (Ar gas) 750 [sccm], ($O_2$ gas) 3.5 [sccm]
Processing time [s]: 3 [s]
<Process ST10c>
Internal pressure of processing vessel 12 [mTorr]: 30 [mTorr]
Value of high frequency power of first high frequency power supply 62 [W]: 100 [W]
Value of high frequency power of second high frequency power supply 64 [W]: 350 [W]
Value of DC voltage of power supply 70 [V]: 0 [V]
Processing gas (gas GH): Ar gas
Flow rate of processing gas [sccm]: 750 [sccm]
Processing time [s]: 4.5 [s]
<Process ST12>
Internal pressure of processing vessel 12 [mTorr]: 80 [mTorr]
Value of high frequency power of first high frequency power supply 62 [W]: 500 [W]
Value of high frequency power of second high frequency power supply 64 [W]: 150 [W]
Value of DC voltage of power supply 70 [V]: 0 [V]
Processing gas (gas GI): $O_2$ gas
Flow rate of processing gas [sccm]: 375 [sccm]
Processing time [s]: 90 [s]
<Sequence SQ1>
Repetition number: 10 times
<Sequence SQ2>
Repetition number: 30 times In the method MT, a part (first layer VL1) of the organic film OL is etched, and then, the protection film SX is conformally formed on the side surface SF of the mask OLM1 formed by this etching before the second layer VL2 of the organic film OL is etched. As stated, in the etching of the organic film OL, the protection film SX is formed, in the series of processes from the sequence SQ1 to the process ST7, on the side surface SF of the mask OLM1 made of the organic film formed after the etching of the organic film OL. Therefore, the mask OLM1 can be suppressed from being etched in the subsequent etching of the second layer VL2. Accordingly, the second layer VL2 can be etched while maintaining the shape of the mask OLM1. Thus, in the etching processing (from the process ST3 to the process ST9) upon the organic film OL including the series of the processes from the sequence SQ1 to the process ST7, a top CD (corresponding to a width of an upper end of the mask OLM1) and a bottom CD (corresponding to a width of the mask OLM2) of the etched organic film can be controlled independently. Furthermore, since the mask ALM is removed in the process ST8 before the etching of the etching target layer EL, the vertical shape of the organic film (the mask OLM1 and the mask OLM2) is maintained at the time when the mask ALM is removed. Thus, a process margin in the subsequent etching processing upon the etching target layer EL can be obtained.

Furthermore, since the gas GE contains halogens such as fluorine or chlorine, the mask ALM can be removed effectively.

Moreover, since the gas GA contains the hydrogen gas and the nitrogen gas, the etching upon the organic film OL (specifically, the first layer VL1) can be performed effectively.

In addition, since the protection film SX is the oxide film, the etching amount of the second layer VL2 can be controlled effectively in case that the second layer VL2 is etched with high selectivity against the oxide film.

Further, since the protection film SX is conformally formed on the side surface SF of the first layer VL1 (particularly, the mask OLM1) by the same method as the ALD (Atomic Layer Deposition) through the sequence SQ1 and the process ST6, the strength of protection for the first layer VL1 (particularly, the mask OLM1) can be improved, and the protection film SX for protecting the first layer VL1 (particularly, the mask OLM1) can be formed in the uniform film thickness.

Furthermore, since the gas GB contains the aminosilane-based gas, through the process ST5a, the reaction precursors of silicon are formed on the first layer or the like along the atomic layer of the side surface SF of the first layer VL1 (particularly, the mask OLM1).

Further, the reaction precursors of silicon can be formed in the process ST5a by using the gas GB containing monoaminosilane.

Moreover, the aminosilane-based gas contained in the gas GB may include aminosilane having one to three amino groups. Further, the aminosilane-based gas contained in the gas GB may be aminosilane having one to three silicon atoms. Furthermore, the aminosilane-based gas contained in the gas GB may be aminosilane having one to three amino groups.

In addition, since the gas GC contains oxygen atoms, in the process ST5c, the oxygen atoms bonds to the reaction precursors of silicon formed on the first layer VL1 (particularly, the mask OLM1) and the like, so that the protection film of silicon oxide can be conformally formed on the first layer VL1 (particularly, the mask OLM1). Further, in case that the gas GC is the carbon dioxide gas, since the gas GC contains carbon atoms, the removal of the first layer VL1 (particularly, the mask OLM1) caused by the oxygen atoms can be suppressed by the corresponding carbon atoms.

Furthermore, the etching upon the protection film SX which is formed by repeating the sequence SQ1 is anisotropically performed by using the plasma of the gas GD containing fluorine, the protection film SX (particularly, the region R2) formed on the surface of the second layer VL2 can be selectively removed. Thus, after this removal, the etching upon the second layer VL2 is enabled.

Moreover, since the gas GD contains the fluorocarbon gas, the protection film SX (particularly, the region R1 and the region R2) formed through the sequence SQ1 and the process ST6 can be etched.

Further, in the process ST3, since the secondary electrons are irradiated to the first layer VL1 (particularly, the mask OLM1) after the first layer VL1 is etched until the second layer VL2 is exposed, the mask OLM1 can be modified before the protection film SX is formed. Therefore, damage upon the mask OLM1 that might be caused by the subsequence process can be suppressed.

Additionally, the second layer VL2, particularly, the fourth layer VL22 is etched until the etching target layer EL is exposed. Then, since the surface FC of the etching target layer EL is exposed, the subsequent etching upon the etching target layer EL is enabled.

Further, the etching of the organic film (the second layer VL2 of the organic film OL, particularly, the fourth layer VL22) can be performed with high verticality by using the plasma of the gas GF containing the hydrogen gas and the nitrogen gas. Thus, the variation in the pattern width formed by the etching can be suppressed.

Furthermore, through the series of processes of the sequence SQ2 and the process ST11, every atomic layer of the etching target layer EL can be removed by the same method as ALE (Atomic Layer Etching) method.

Moreover, if the thickness LM of the second layer VL2 is in the range from 10 nm to 20 nm, the width of the second layer VL2 can be adjusted appropriately in the process ST8.

From the foregoing, it will be appreciated that the exemplary embodiment of the present disclosure has been described herein for purposes of illustration, and that various modifications may be made without departing from the scope and spirit of the present disclosure. Accordingly, the embodiment disclosed herein is not intended to be limiting. The scope of the inventive concept is defined by the following claims and their equivalents rather than by the detailed description of the exemplary embodiment. It shall be understood that all modifications and embodiments conceived from the meaning and scope of the claims and their equivalents are included in the scope of the inventive concept.

We claim:

1. A method of processing a target object having an etching target layer, an organic film provided on the etching target layer and a first mask provided on the organic film, the organic film including a first layer and a second layer, the first mask being provided on the first layer, the first layer being provided on the second layer, and the second layer being provided on the etching target layer, the method comprising:
    generating plasma of a first gas within a processing vessel of a plasma processing apparatus in which the target object is accommodated; etching the first layer with the plasma of the first gas and the first mask until the second layer is exposed; and conformally forming a protection film on a side surface of the first layer formed by the etching;
    generating plasma of a second gas within the processing vessel and removing the first mask with the plasma of the second gas; and
    after removing the first mask, etching the second layer by using the first layer and the protection film as a second mask,
    wherein the removing of the first mask is performed before the etching target layer is etched.

2. The method of claim 1,
wherein the second gas contains any one of a hydrofluorocarbon gas, a fluorocarbon gas and a chlorine gas.

3. The method of claim 1,
wherein the first gas contains a hydrogen gas and a nitrogen gas.

4. The method of claim 1,
wherein the protection film is an oxide film.

5. The method of claim 1,
wherein the conformally forming of the protection film comprises irradiating secondary electrons to the first layer by generating plasma within the processing vessel and applying a negative DC voltage to an upper electrode provided in the processing vessel before the conformally forming the protection film on the side surface of the first layer and after the etching of the first layer until the second layer is exposed.

6. The method of claim 1,
wherein the second layer has a thickness ranging from 10 nm to 20 nm before the removing of the first mask.

7. The method of claim 1,
wherein, during the etching of the second layer, plasma of a sixth gas is generated within the processing vessel; and the second layer is etched until the etching target layer is exposed by using the plasma of the sixth gas, the first layer and the protection film while maintaining a shape of the etched first layer.

8. The method of claim 7,
wherein the sixth gas contains a nitrogen gas and a hydrogen gas.

9. The method of claim 7, further comprising:
etching the etching target layer after the etching of the second layer,
wherein, in the etching of the etching target layer, the etching target layer is etched by removing every atomic layer of the etching target layer by repeatedly performing a second sequence comprising:
generating plasma of a seventh gas within the processing vessel; and forming a mixed layer containing radicals contained in the plasma of the seventh gas on an atomic layer of a surface of the etching target layer;
purging a space within the processing vessel after the forming of the mixed layer;
generating plasma of an eighth gas within the processing vessel after the purging of the space; and removing the mixed layer by applying a bias voltage to the plasma of the eighth gas; and
purging the space within the processing vessel after the removing of the mixed layer, wherein the seventh gas contains a fluorocarbon gas, a rare gas and an oxygen gas, and the eighth gas contains a rare gas.

10. The method of claim 1,
wherein, in the conformally forming of the protection film, the protection film is conformally formed on the side surface of the first layer by repeatedly performing, after the etching of the first layer until the second layer is exposed, a first sequence comprising:
supplying a third gas into the processing vessel;
purging a space within the processing vessel after the supplying of the third gas;
generating plasma of a fourth gas within the processing vessel after the purging of the space; and
purging the space within the processing vessel after the generating of the plasma of the fourth gas, and
wherein, in the supplying of the third gas, plasma of the third gas is not generated.

11. The method of claim 10,
wherein the fourth gas contains an oxygen atom.

12. The method of claim 11,
wherein the fourth gas contains a carbon dioxide gas or an oxygen gas.

13. The method of claim 10,
wherein the conformally forming of the protection film further comprises:
generating plasma of a fifth gas within the processing vessel after the repeatedly performing of the first sequence; and removing a film, which is formed on a surface of the second layer by the repeatedly performing of the first sequence, with the plasma of the fifth gas, and
wherein the fifth gas contains fluorine.

14. The method of claim 13,
wherein the fifth gas contains a fluorocarbon gas.

15. The method of claim 10,
wherein the third gas contains an aminosilane-based gas.

16. The method of claim 15,
wherein the third gas contains monoaminosilane.

17. The method of claim 15,
wherein the aminosilane-based gas contained in the third gas includes aminosilane having one to three silicon atoms.

18. The method of claim 15,
wherein the aminosilane-based gas contained in the third gas includes aminosilane having one to three amino groups.

* * * * *